(12) United States Patent
Lang et al.

(10) Patent No.: US 12,169,646 B2
(45) Date of Patent: Dec. 17, 2024

(54) MANAGING THRESHOLD VOLTAGE DRIFT BASED ON OPERATING CHARACTERISTICS OF A MEMORY SUB-SYSTEM

(71) Applicant: Micron Technology, Inc., Boise, ID (US)

(72) Inventors: Murong Lang, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/716,689

(22) Filed: Apr. 8, 2022

(65) Prior Publication Data

US 2022/0229603 A1 Jul. 21, 2022

Related U.S. Application Data

(63) Continuation of application No. 16/552,165, filed on Aug. 27, 2019, now Pat. No. 11,307,799.

(51) Int. Cl.
| | |
|---|---|
| *G06F 3/06* | (2006.01) |
| *G11C 7/10* | (2006.01) |
| *G11C 7/22* | (2006.01) |

(52) U.S. Cl.
CPC .......... *G06F 3/0659* (2013.01); *G06F 3/0614* (2013.01); *G06F 3/0632* (2013.01); *G06F 3/0673* (2013.01); *G11C 7/1051* (2013.01); *G11C 7/1096* (2013.01); *G11C 7/22* (2013.01)

(58) Field of Classification Search
None
See application file for complete search history.

(56) References Cited

U.S. PATENT DOCUMENTS

| | | | |
|---|---|---|---|
| 8,737,136 B2 | 5/2014 | Cometti | |
| 9,543,033 B1* | 1/2017 | Shinohara | ......... G11C 16/3459 |
| 10,031,699 B1 | 7/2018 | Graniello et al. | |
| 10,908,845 B1 | 2/2021 | Lang et al. | |
| 2008/0285351 A1 | 11/2008 | Shlick et al. | |

(Continued)

FOREIGN PATENT DOCUMENTS

CN 107039080 A 8/2017

OTHER PUBLICATIONS

Office Action for Chinese Patent Application No. 202010870129.3, mailed Nov. 9, 2023, 12 Pages.

*Primary Examiner* — Brian R Peugh
(74) *Attorney, Agent, or Firm* — LOWENSTEIN SANDLER LLP

(57) ABSTRACT

A data structure including a target read voltage level corresponding to each set of values of a plurality of sets of values corresponding to a plurality of operating characteristics is stored. In response to a read command associated with a memory cell, a current set of measured values of the plurality of operating characteristics associated with the memory cell is measured. A match between a first set of values of the plurality of sets of values corresponding to the plurality of operating characteristics and the current set of measured values is identified. Using the data structure, a first stored target read voltage level corresponding to the match between the first set of values and the current set of measured values is identified. The read command is executed using the first stored target read voltage level.

18 Claims, 6 Drawing Sheets

| Optimized Read Voltage Level | Write to Write Delay Time (W2W delay time) | Write to Read Delay time (W2R delay time) | Temperature (Celsius) | Cycling |
|---|---|---|---|---|
| Read Voltage Levels | Value 1, Value 2, Value 3 | Value 1, Value 2, Value 3 | Value 1, Value 2, Value 3 | Value 1, Value 2, Value 3 |

(56) References Cited

U.S. PATENT DOCUMENTS

| | | |
|---|---|---|
| 2009/0323412 A1 | 12/2009 | Mokhlesi et al. |
| 2011/0261626 A1* | 10/2011 | Kim .................. G11C 16/0483 |
| | | 365/185.25 |
| 2012/0008414 A1 | 1/2012 | Katz et al. |
| 2012/0102259 A1 | 4/2012 | Goss et al. |
| 2012/0134213 A1 | 5/2012 | Choi et al. |
| 2012/0230142 A1 | 9/2012 | Ang et al. |
| 2014/0226388 A1 | 8/2014 | Khoueir et al. |
| 2014/0281119 A1 | 9/2014 | Hyun et al. |
| 2015/0169468 A1 | 6/2015 | Camp et al. |
| 2017/0200492 A1 | 7/2017 | Yang et al. |
| 2017/0200505 A1* | 7/2017 | Jin ....................... G06F 3/0659 |
| 2017/0358346 A1 | 12/2017 | Zhang et al. |
| 2018/0189135 A1 | 7/2018 | Naik et al. |
| 2019/0066802 A1 | 2/2019 | Malshe et al. |
| 2020/0035307 A1* | 1/2020 | Zeng ...................... G11C 16/28 |
| 2020/0073451 A1 | 3/2020 | Nowell et al. |

\* cited by examiner

| write to write delay | write to read delay | Die Temperature | Cycling condition | Optimized Read Voltage Level (Volts) |
|---|---|---|---|---|
| 50us | 50us | 0C | 1 | 5.1 |
| 50us | 50us | 25C | 1 | 5.15 |
| 50us | 50us | 70C | 1 | 5.2 |
| 50us | 10s | 0C | 1 | 5.2 |
| 50us | 10s | 25C | 1 | 5.25 |
| 50us | 10s | 70C | 1 | 5.35 |
| 50us | 1hr | 0C | 1 | 5.35 |
| 50us | 1hr | 25C | 1 | 5.45 |
| 50us | 1hr | 70C | 1 | 5.6 |
| 50us | 50us | 0C | 10000 | 5.05 |
| 50us | 50us | 25C | 10000 | 5.1 |
| 50us | 50us | 70C | 10000 | 5.15 |
| 50us | 10s | 0C | 10000 | 5.15 |
| 50us | 10s | 25C | 10000 | 5.2 |
| 50us | 10s | 70C | 10000 | 5.3 |
| 50us | 1hr | 0C | 10000 | 5.3 |
| 50us | 1hr | 25C | 10000 | 5.4 |
| 50us | 1hr | 70C | 10000 | 5.55 |
| 1hr | 50us | 0C | 1 | 5.15 |
| 1hr | 50us | 25C | 1 | 5.2 |
| 1hr | 50us | 70C | 1 | 5.25 |
| 1hr | 10s | 0C | 1 | 5.25 |
| 1hr | 10s | 25C | 1 | 5.3 |
| 1hr | 10s | 70C | 1 | 5.4 |
| 1hr | 1hr | 0C | 1 | 5.4 |
| 1hr | 1hr | 25C | 1 | 5.5 |
| 1hr | 1hr | 70C | 1 | 5.65 |
| 1hr | 50us | 0C | 10000 | 5.1 |
| 1hr | 50us | 25C | 10000 | 5.15 |
| 1hr | 50us | 70C | 10000 | 5.2 |
| 1hr | 10s | 0C | 10000 | 5.2 |
| 1hr | 10s | 25C | 10000 | 5.25 |
| 1hr | 10s | 70C | 10000 | 5.35 |
| 1hr | 1hr | 0C | 10000 | 5.35 |
| 1hr | 1hr | 25C | 10000 | 5.45 |
| 1hr | 1hr | 70C | 10000 | 5.6 |

FIG. 4

MANAGING THRESHOLD VOLTAGE DRIFT BASED ON OPERATING CHARACTERISTICS OF A MEMORY SUB-SYSTEM

CROSS-REFERENCE TO RELATED APPLICATION

This application is a continuation of U.S. patent application Ser. No. 16/552,165, filed on Aug. 27, 2019, now U.S. Pat. No. 11,307,799, the entirety of which is hereby incorporated by reference herein.

TECHNICAL FIELD

Embodiments of the disclosure relate generally to memory sub-systems, and more specifically, relate to managing threshold voltage drift based on operating characteristics of a memory sub-system.

BACKGROUND

A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

FIG. 4 illustrates a table including example optimized read voltage levels corresponding to example sets of operating characteristic values of a memory sub-system in accordance with some embodiments.

DETAILED DESCRIPTION

Figure 1:
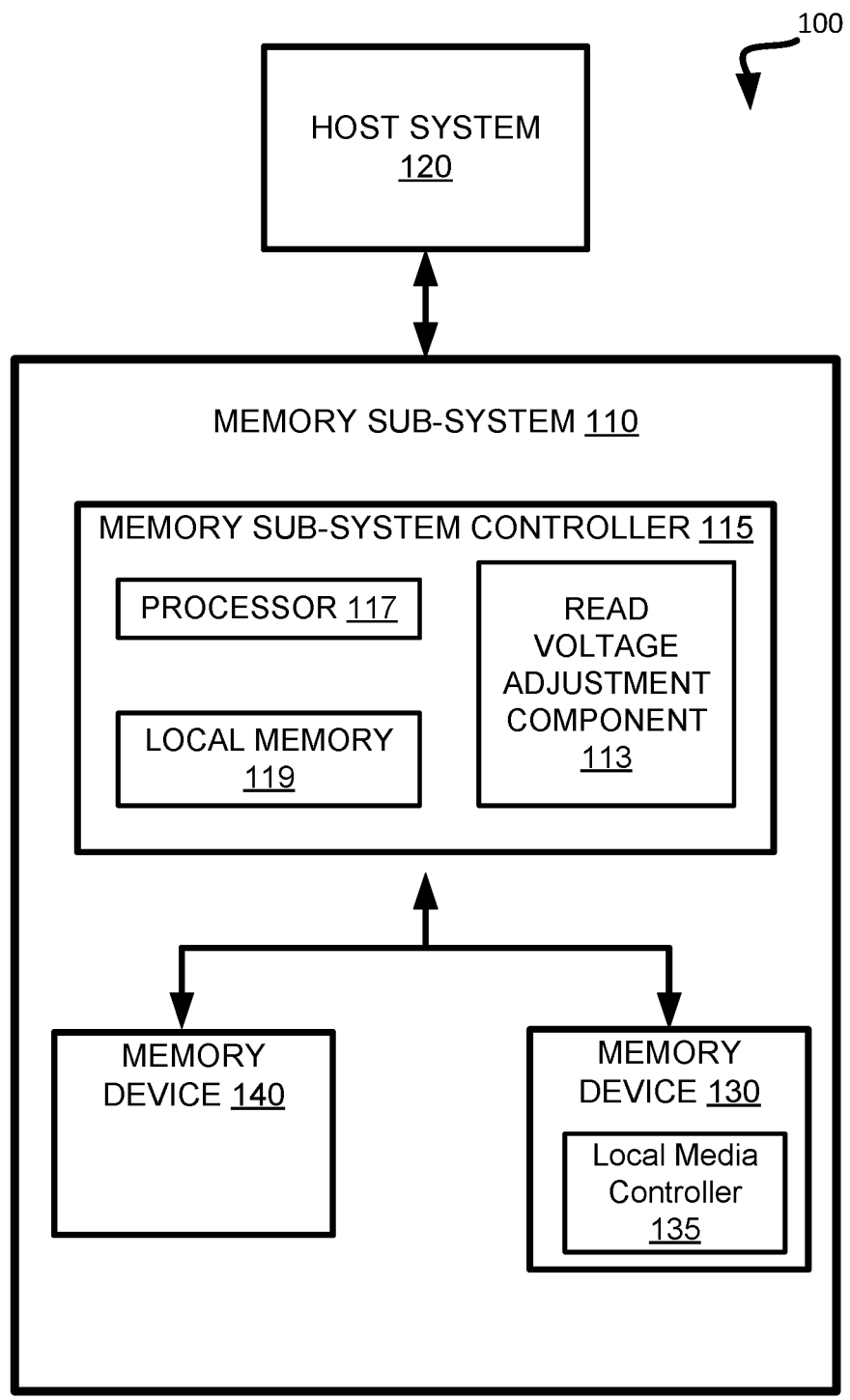
FIG. 1 illustrates an example computing environment that includes a memory sub-system in accordance with some embodiments of the present disclosure.

Aspects of the present disclosure are directed to managing threshold voltage drift based on operating characteristics of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can provide data to be stored at the memory sub-system and can request data to be retrieved from the memory sub-system.

The memory devices can be non-volatile memory devices, such as three-dimensional cross-point ("3D cross-point") memory devices that are a cross-point array of non-volatile memory that can perform bit storage based on a change of bulk resistance, in conjunction with a stackable cross-gridded data access array. Another example of a non-volatile memory device is a negative-and (NAND) memory device. Other examples of non-volatile memory devices are described below in conjunction with FIG. 1.

Each of the memory devices can include one or more arrays of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values. For example, a single level cell (SLC) can store one bit of information and has two logic states. The various logic states have corresponding threshold voltage levels. A threshold voltage (VT) is the voltage applied to the cell circuitry (e.g., control gate at which a transistor becomes conductive) to set the state of the cell. A cell is set to one of its logic states based on the VT that is applied to the cell. For example, if a high VT is applied to an SLC, a charge will be present in the cell, setting the SLC to store a logic 0. If a low VT is applied to the SLC, charge will be absent in the cell, setting the SLC to store a logic 1.

For certain memory types (i.e., for memory sub-systems employing certain types of storage media), error rates can vary over time. In particular, some non-volatile memories have threshold voltage programming distributions that move or "drift" higher over time. At a given read voltage level (i.e., a value of the voltage applied to a memory cell as part of a read operation), if the threshold voltage programming distributions move, then certain reliability statistics can also be affected. One example of a reliability statistic is a bit error rate (BER). The BER can be defined as the ratio of the number of erroneous bits to the number of all data bits stored in a unit of the memory sub-system, where the unit can be the entire memory sub-system, a die of memory device, a collection of codewords, or any other meaningful portion of the memory sub-system.

A read operation can be performed with a read voltage level. The read threshold voltage level or value (herein the "read voltage level") can be a particular voltage that is applied to memory cells of a memory device to read the data stored at the memory cells. For example, if a threshold voltage of a particular memory cell is identified as being below the read voltage level that is applied to the particular memory cell, then the data stored at the particular memory cell can be a particular value (e.g., '1') and if the threshold voltage of the particular memory cell is identified as being above the read voltage level, then the data stored at the particular memory cell can be another value (e.g., '0'). Thus, the read voltage level can be applied to memory cells to determine values stored at the memory cells.

In a conventional memory sub-system, when the threshold voltage programming distributions of a memory cell change, the application of the read voltage level can be inaccurate relative to the changed threshold voltage. For example, a memory cell can be programmed to have a threshold voltage below the read voltage level. The programmed threshold voltage can change over time and can shift to be above the read voltage level. For example, the threshold voltage of the memory cell can shift from initially being below the read voltage level to being above the read voltage level. As a result, when the read voltage level is applied to the memory cell, the data stored at the memory cell can be misread or misinterpreted to be at a wrong value as compared to the value as originally stored when the threshold voltage had not yet shifted.

The speed or rate of the drift of the threshold voltage programming distributions and corresponding BER of a conventional memory sub-system can be affected by one or more operating characteristics of the memory sub-system. Example operating characteristics include die temperature, write-to-write (W2W) delay time (i.e., a period of time that passes between a current write operation and a previous write operation associated with a unit of the memory device), a write-to-read (W2R) delay time (i.e., a period of time that passes between when data is written to a unit of the memory device and when the data is read from the unit of the memory device), and a write/read cycling condition of the memory device (i.e., a number of times a memory device has been erased and programmed).

For example, the drift speed is faster at higher die temperatures than at lower temperatures when experiencing a same W2R delay time. For example, longer W2R delay times produce greater threshold voltage drifts as compared to shorter W2R delay times. In this example, the read retry trigger rate (i.e., a rate of errors that trigger error correction processing) is higher for longer W2R delay times than it is for shorter W2R delay times. Conventional memory sub-systems employ a read scrub operation (e.g., a three hour read scrub where an entire memory sub-system is read once every three hours) and a write scrub operation (i.e., a write operation that forces toggling between a '0' value to a I' value and vice versa on a periodic basis, such as every twelve hours) to refresh or push the threshold voltage programming distributions down to combat the drift. However, the read and write scrub operations degrade the quality of service of the memory sub-system due to the frequent performance of read operations and results in unnecessary read disturb which reduces reliability.

Aspects of the present disclosure address the above and other deficiencies by having a memory sub-system that identifies an optimized read voltage level (or read voltage level range) that minimizes or reduces a BER corresponding to a threshold voltage programming distribution experiencing drift due to a set of operating characteristics (i.e., a current set of values of the one or more operating characteristics). In particular, an optimized read voltage level can be determined as a function of a set of values of the operating characteristics (e.g., the W2W delay time, the W2R delay time, the temperature, and the cycling information) of the memory sub-system.

Advantages of the present disclosure include, but are not limited to, a decrease in the error rate of the memory sub-system. Advantageously, an optimized read voltage level can be determined and applied in connection with a read operation to counteract threshold voltage drift caused by the current operating characteristics. Furthermore, the identification and application of an optimized read voltage level corresponding to a set of current operating conditions (e.g., W2W delay time, W2R delay time, die temperature, and cycling condition) counteracts the threshold voltage drift caused by the operating conditions. The adjustment of the read voltage level as a function of the operating conditions reduces read-retry trigger rate and improves the performance of the memory sub-system due to improved data integrity. In addition, the systems and methods of the present disclosure reduce or eliminate the read scrub frequency and avoids unnecessary read disturb errors.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, a vehicle (e.g., airplane, drone, train, automobile, or other conveyance), Internet of Things (IoT) devices, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point type memory are described, the memory device 130 can be based on any other type of non-volatile memory, such as negative-and (NAND), read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory component can include an SLC portion, and an MLC portion, a TLC portion, or a QLC portion of memory cells. The memory cells of the memory devices 130 can be grouped as pages or codewords that can refer to a logical unit of the memory device used to store data. With some types of memory (e.g., NAND), pages can be grouped to form blocks. Some types of memory, such as 3D cross-point, can group pages across dice and channels to form management units (MUs).

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a read voltage adjustment component 113 that can be used to identify an optimized read voltage level corresponding to a current set of operating characteristics and apply the optimized read voltage level in executing a read operation relating to data stored at the memory sub-system 110. In some embodiments, the controller 115 includes at least a portion of the read voltage adjustment component 113. For example, the controller 115 can include a processor 117 (processing device) configured to execute instructions stored in local memory 119 for performing the operations described herein. In some embodiments, the read voltage adjustment component 113 is part of the host system 120, an application, or an operating system. In the same or alternative embodiments, portions of the read voltage adjustment component 113 are part of the host system 120 while other portions of the read voltage adjustment component 113 are performed at the controller 115.

The read voltage adjustment component 113 can be used to store a data structure (e.g., a table) including optimized read voltage levels corresponding to multiple sets of operating characteristics values, such as W2W delay times, W2R delay times, die temperatures, and cycling conditions. In an embodiment, the read voltage adjustment component 113 identifies the optimized read voltage level corresponding to a minimal BER for each set of operating characteristic values. During operation of the memory sub-system, the read voltage adjustment component 113 determines a current set of operating characteristic values and, using the data structure (e.g., via a table look-up operation), identifies a corresponding optimized read voltage level. To counteract threshold voltage drift due to the operating characteristics, the read voltage level can be adjusted to the optimized read voltage level and a read operation can be executed. Further details with regards to the operations of the read voltage adjustment component 113 are described below.

Figure 2:
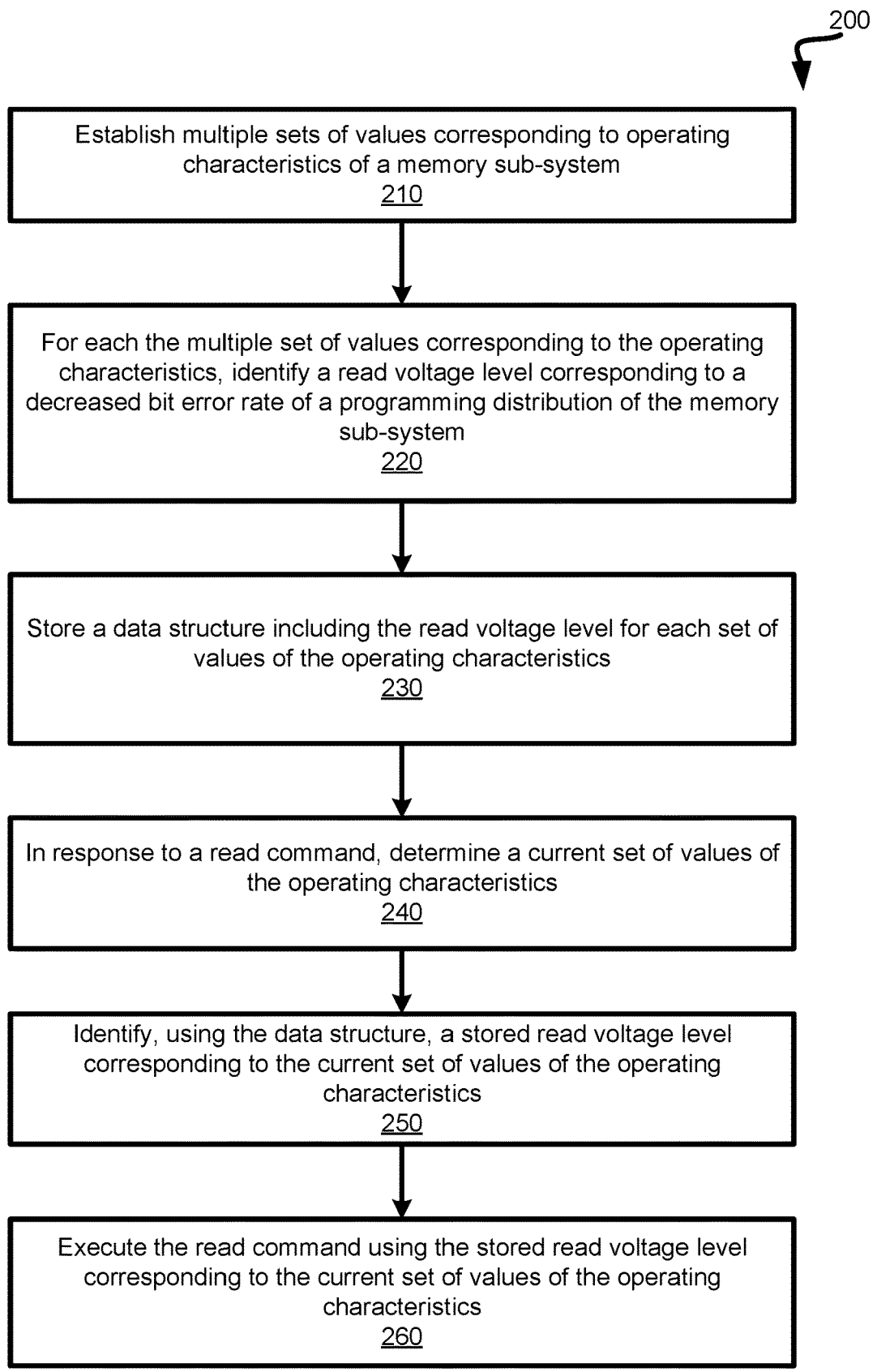
FIG. 2 is a flow diagram of an example method to execute a read command using an optimized read voltage level corresponding to a current set of operating characteristics in accordance with some embodiments.

FIG. 2 is a process flow diagram of an example method 200 to execute a read command using an optimized read voltage level corresponding to a current set of operating characteristics in accordance with some embodiments. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the read voltage adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2, at operation 210, the processing logic establishes multiple sets of values corresponding to operating characteristics of a memory sub-system. In an embodiment, the operating characteristics can include one or more of a W2W delay time, a W2R delay time, a die temperature, and a cycling condition. In an embodiment, during a setup or initial phase, the memory sub-system can be operated by setting selected values of each of the operating characteristics to establish multiple different sets and combinations of values for the operating characteristics. In an example, selected values of each of the operating characteristics (e.g., values of 50 microseconds (μs), 10 seconds (s), 1 hour (hr) can be established for the W2W delay time and the W2R delay time; values of 0 degrees Celsius (C), 25 C, and 70 C can be established for the die temperature; and values of 1, 10K, and 100K can be established for the cycling condition).

At operation 220, for each of the multiple set of values corresponding to the operating characteristics, the processing logic identifies a read voltage level corresponding to a decreased bit error rate of a programming distribution of the memory sub-system. In an embodiment, for each combination of values of the operating characteristics, a read voltage level associated with the decreased bit error rate (e.g., a lowest relative bit error rate among a set of different read voltage levels) is identified and established as the optimized read voltage level. For example, the decreased bit error rate corresponding to a W2W delay time of 50 μs, a W2R delay time of 10 s, a die temperature of 25 C, and cycling condition of 100K can be determined and used to identify a corresponding read voltage level (e.g., an "optimized read voltage level").

Figure 3:
FIG. 3 illustrates an example association of optimized read voltage values corresponding to operating characteristic values of a memory sub-system in accordance with some embodiments.

FIG. 3 illustrates an example data structure 300 including different operating characteristics 310 (e.g., W2W delay time, W2R delay time, temperature, and cycling) and example values (e.g., Value 1, Value 2, Value 3) that can be established during operation 210 of FIG. 2. In an embodiment, for each combination or set of values for the operating characteristics 310, an optimized read voltage level 320 (e.g., a read voltage level corresponding to a decreased bit error rate) is identified and stored, as described above in connection with operation 220 of FIG. 2.

At operation 230, the processing logic stores a data structure including the read voltage level for each set of values of the operating characteristics. In an embodiment, the data structure (e.g., a table) is stored in a data store (e.g., a fuse ROM of the memory sub-system) operatively coupled to the read voltage adjustment component 113 of FIG. 1. In an embodiment, the data structure includes the identified read voltage level (e.g., the read voltage level optimized to decrease or reduce the bit error rate) for the multiple different scenarios or combinations of values of the operating characteristics.

FIG. 4 illustrates an example table 400 including multiple operating characteristics 410 (e.g., write-to-write delay time 410A, write-to-read delay time 410B, die temperature 410C, and cycling condition 410D). As shown in FIG. 4, multiple different sets of values for the multiple operating characteristics 410 are established and a corresponding optimized read voltage 420 (e.g., a read voltage level corresponding to a decreased bit error rate) is identified and stored. For example, a set of values of the operating characteristics 430 (e.g., a W2W delay time of 50 μs, a W2R delay time of 10 s, a die temperature of 25 C, and a cycling condition of 1) is stored in the table 400 along with the corresponding optimized read voltage level 430 (e.g., 5.25 Volts). As shown in the example table 400, an optimized read voltage level is identified for each of the multiple different sets of values of the operating characteristics (e.g., set 430).

At operation 240, in response to a read command, the processing logic determines a current set of values of the operating characteristics. In an embodiment, upon identification of a new read command, the processing logic measures the operating characteristic values. For example, in response to a read command, the processing logic can determine a first value corresponding to the W2W delay time, a second value corresponding to the W2R delay time, a third value corresponding to the die temperature, and a fourth value corresponding to the cycling condition (e.g., collectively, the current set of values corresponding to the operating characteristics). An example process including a determination of the current set of values is described in detail below with respect to FIG. 5.

In operation 250, the processing logic identifies, using the data structure, a stored read voltage level corresponding to the current set of values of the operating characteristics. In an embodiment, the stored read voltage level can be identified by performing a look-up operation of a table (e.g., table 400 of FIG. 4) to identify a set of values of the operating characteristics (e.g., set of values 430 of FIG. 4) corresponding to the current set of values and identify the read voltage level (e.g., optimized read voltage level 420 of FIG. 4) stored in association with the set of values of the operating characteristics.

In operation 260, the processing logic executes the read command using the stored read voltage level corresponding to the current set of values of the operating characteristics. In an embodiment, the optimized read voltage level is used in executing a read operation in response to the read command. Advantageously, adjusting a previous read voltage level to the optimized voltage value to perform the read results in the application of an accurate read voltage which accounts for threshold voltage drift caused by the then current operating characteristics of the memory sub-system.

Figure 5:
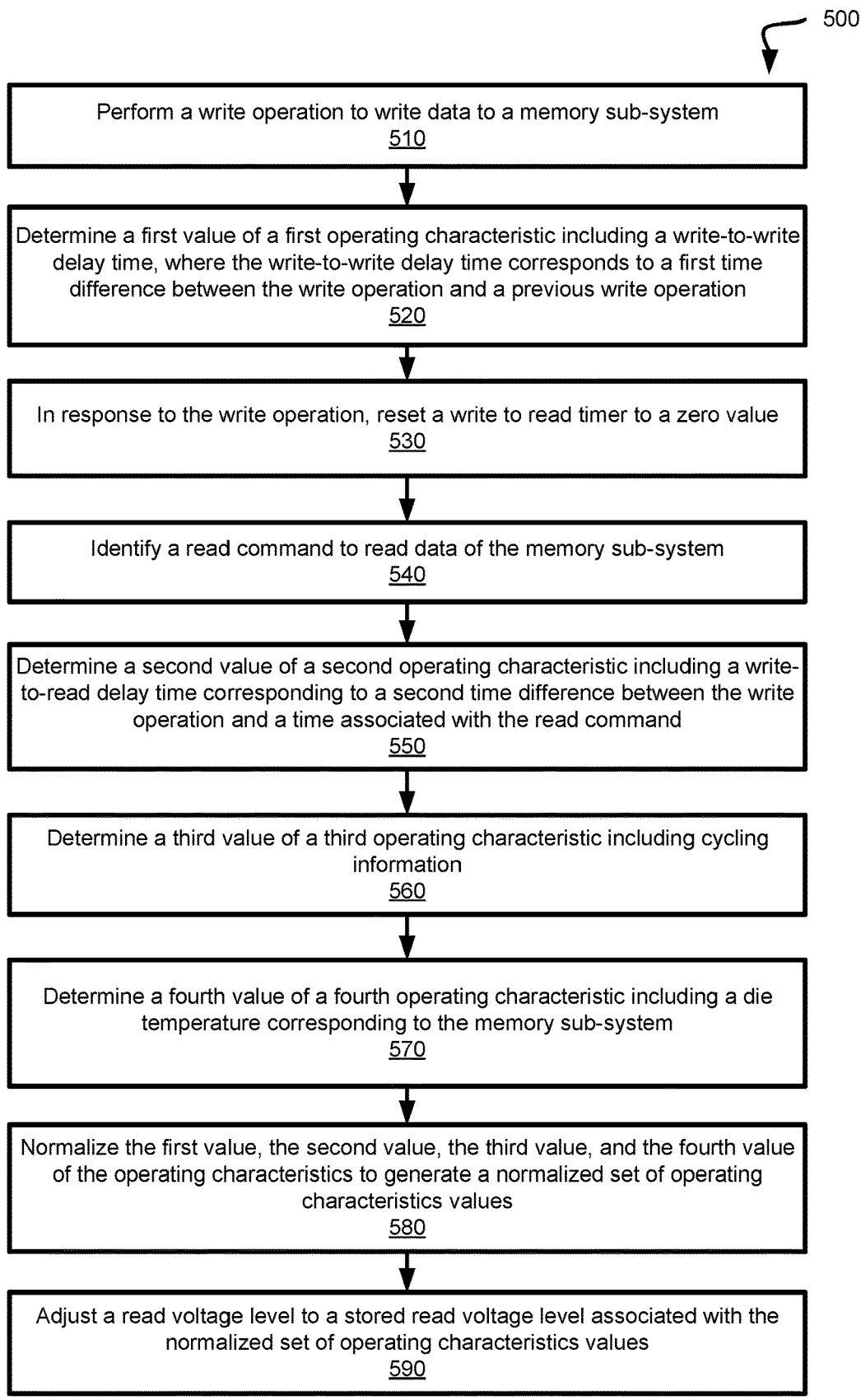
FIG. 5 is a flow diagram of an example method adjust a read voltage level to an optimized read voltage level associated with a set of operating characteristic values in accordance with some embodiments.

FIG. 5 is a flow diagram of an example method 500 to adjust a read voltage level to an optimized read voltage level to account for threshold voltage drift due to operating characteristics of the memory sub-system in accordance with some embodiments. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the read voltage adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In operation 510, the processing logic performs a write operation to write data to a memory sub-system. In an embodiment, a time corresponding to execution of the write operation can be recorded (e.g., recordation of a timestamp) by the processing logic. In operation 520, the processing logic determines a first value of a first operation characteristic including a write-to-write delay time, where the write-to-write delay time corresponds to a first time difference between the write operation (e.g., the write operation of operation 510) and a previous write operation. In an embodiment, for each write operation performed by the processing logic (e.g., the write operation of operation 210 and a previous write operation), a corresponding time of execution is recorded. In an embodiment, the W2W delay time is calculated by determining a time difference between a current write operation and a prior write operation.

In operation 530, in response to the write operation, the processing logic resets a write-to-read time to a zero value. In an embodiment, the processing logic maintains a timer that measures a time between a write operation (e.g., the write operation of operation 510) and a subsequent or next read operation. In an embodiment, the timer runs from the time of a write operation and is stopped at the time of a next read operation.

In operation 540, the processing logic identifies a read command to read data of the memory sub-system. In an embodiment, the read command can be issued by a host system (e.g., host system 120 of FIG. 1) to read data from a memory die of the memory sub-system.

In operation 550, the processing logic determines a second value of a second operating characteristic including a write-to-read delay time corresponding to a second time difference between the write operation and a time associated with the read command. In an embodiment, the write-to-read delay time is a measurement of the time between a most recent write operation and a next read operation, as represented by the write-to-read timer.

In operation 560, the processing logic determines a third value of a third operating characteristic including cycling information. In an embodiment, in response to the read command, the processing logic measures the cycling condition of the memory sub-system and records the associated value. In an embodiment, in response to the read command, the processing logic performs a look-up operation to identify a current or most recently recorded cycling condition value. In operation 570, the processing logic determines a fourth value of a fourth operating characteristic including a die temperature corresponding to the memory sub-system. In an embodiment, in response to the read command, the processing logic measures the temperature of the die relating to the read command. In an embodiment, in response to the read command, the processing logic performs a look-up operation to identify a current or most recently recorded die temperature value.

In operation 580, the processing logic normalizes the first value, the second value, the third value, and the fourth value of the operating characteristics to generate a normalized set of operating characteristics values. In an embodiment, the processing logic normalizes the determined or measured values for the W2W delay time, the W2R delay time, the die temperature, and the cycling condition to match with a set of values stored in a data store (e.g., table 400 of FIG. 4). In an embodiment, because the determined or measured values may not match the exact values used to establish the table, the values are normalized to match the table values. For example, the normalizing can include rounding the determined first value and second value down (or up) to a nearest preset value (e.g., a value of 50 µs, 10 s, or 1 hour) corresponding to the first operating characteristic (i.e., the W2W delay time) and the second operating characteristic (i.e., the W2R delay time). In addition, a rounding operation can be performed on the third value (e.g., the die temperature value) and the fourth value (e.g., the cycling condition value) to match a nearest preset value (e.g., a die temperature of 0 C, 25 C, or 70 C or a cycling condition value of 1, 10K, or 100K). It is noted that any suitable normalizing mechanism or technique can be applied to translate the determined current set of values of the operating characteristics to a corresponding set of values of the data structure (e.g., the set of values 430 of FIG. 4) to enable the identification of a corresponding optimized read voltage.

In operation 590, the processing logic adjusts a read voltage level to an optimized read voltage level associated with the normalized set of operating characteristics values. In an embodiment, the processing logic applies the optimized read voltage level determined via a look-up operation of the data structure (e.g., the table 400 of FIG. 4) in executing the read operation in view of the read command identified in operation 540. For example, the read voltage level for values in the table 400 that match the normalized set of operating characteristics can be used for the read operation. Advantageously, dynamically adjusting the read voltage level to the optimized read voltage level reduces the associated bit error rate and counteracts the threshold voltage drift resulting from the current operating characteristics.

Figure 6:
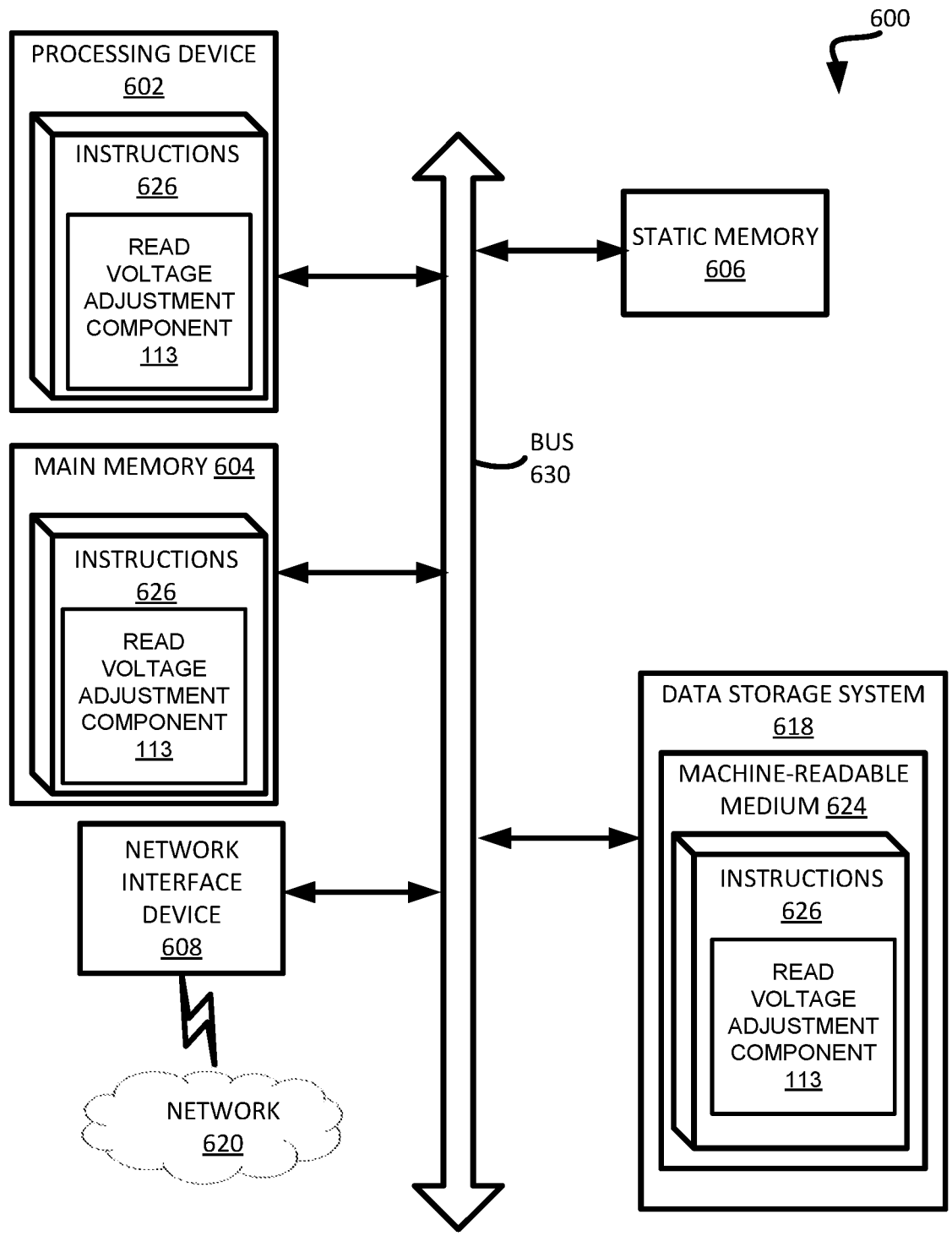
FIG. 6 is a block diagram of an example computer system in which implementations of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to a read voltage adjustment component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a read voltage adjustment component (e.g., the read voltage adjustment component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:

storing a data structure comprising a target read voltage level corresponding to each set of values of a plurality of sets of values corresponding to a plurality of operating conditions of a memory device of a memory sub-system, wherein the plurality of operating conditions comprises two or more of a write-to-write delay time, a write-to-read delay time, a memory die temperature, or a cycling condition;

in response to receiving a command to execute a read operation associated with a memory cell of the memory device, measuring a current set of measured values of the plurality of operating conditions associated with the memory cell;

identifying a match between a first set of values of the plurality of sets of values corresponding to the plurality of operating conditions and the current set of measured values of the plurality of operating conditions;

identifying, using the data structure, a first stored target read voltage level corresponding to the match between the first set of values and the current set of measured values of the plurality of operating conditions; and executing, by a processing device, the read operation using the first stored target read voltage level.

2. The method of claim 1, further comprising comparing the current set of measured values and at least a portion of the plurality of sets of values corresponding to the plurality of operating conditions to identify the match.

3. The method of claim 1, further comprising executing a look up operation using the data structure to determine a stored target read voltage level corresponding to the current set of measured values.

4. The method of claim 1, further comprising performing a write operation to write data to the memory device.

5. The method of claim 4, further comprising determining a first value of the current set of measured values, wherein the first value comprises a first time difference between the write operation and a previous write operation.

6. The method of claim 5, further comprising determining a second value of the current set of measured values, wherein the second value comprises a second time difference between the write operation and a time associated with the command.

7. A non-transitory computer readable medium comprising instructions, which when executed by a processing device, cause the processing device to perform operations comprising:

storing a data structure comprising a target read voltage level corresponding to each set of values of a plurality of sets of values corresponding to a plurality of operating conditions of a memory device of a memory sub-system, wherein the plurality of operating conditions comprises two or more of a write-to-write delay time, a write-to-read delay time, a memory die temperature, or a cycling condition;

in response to receiving a command to execute a read operation associated with a memory cell of the memory device, measuring a current set of measured values of the plurality of operating conditions associated with the memory cell;

identifying a match between a first set of values of the plurality of sets of values corresponding to the plurality of operating conditions and the current set of measured values;

identifying, using the data structure, a first stored target read voltage level corresponding to the match between the first set of values and the current set of measured values; and executing the read operation using the first stored target read voltage level.

8. The non-transitory computer readable medium of claim 7, wherein the data structure comprises a plurality of read voltage levels, wherein each of the plurality of read voltage levels corresponds to a decreased bit error rate of a programming distribution associated with each set of values of the plurality of operating conditions.

9. The non-transitory computer readable medium of claim 7, the operations further comprising:

normalizing the current set of measured values to generate a normalized set of values; and identifying, from the data structure, a first set of values of the plurality of operating conditions that matches the normalized set of values, wherein the first stored target read voltage level used in executing of the command is associated with the first set of values.

10. The non-transitory computer readable medium of claim 7, the operations further comprising performing a write operation to write data to the memory device.

11. The non-transitory computer readable medium of claim 10, the operations further comprising determining a first value of the current set of values, wherein the first value comprises a first time difference between the write operation and a previous write operation.

12. The non-transitory computer readable medium of claim 11, the operations further comprising:

determining a second value of the current set of values, wherein the second value comprises a second time difference between the write operation and a time associated with the command;

determining a third value of the current set of values, wherein the third value comprises a temperature of a die associated with the command; and determining a fourth value of the current set of values, wherein the fourth value comprises a cycling condition associated with the memory sub-system.

13. A system comprising:

a memory component; and a processing device, operatively coupled with the memory component, to execute operations comprising:

storing a data structure comprising a target read voltage level corresponding to each set of values of a plurality of sets of values corresponding to a plurality of operating conditions, wherein the plurality of operating conditions comprises two or more of a write-to-write delay time, a write-to-read delay time, a memory die temperature, or a cycling condition;

in response to receiving a command to execute a read operation associated with a memory cell of the memory component, measuring a current set of measured values of the plurality of operating conditions associated with the memory cell;

identifying a match between a first set of values of the plurality of sets of values corresponding to the plurality of operating conditions and the current set of measured values of the plurality of operation conditions;

identifying, using the data structure, a first stored target read voltage level corresponding to the match between the first set of values and the current set of measured values; and executing the read operation using the first stored target read voltage level.

14. The system of claim 13, the operations further comprising comparing the current set of values and at least a portion of the plurality of operating conditions stored in the data structure to identify the match.

15. The system of claim 13, the operations further comprising executing a look up operation using the data structure to determine the first stored target read voltage level corresponding to the current set of values of the operating conditions.

16. The system of claim 15, the operations further comprising performing a write operation to write data to the memory component.

17. The system of claim 16, the operations further comprising determining a first value of the current set of values, wherein the first value comprises a first time difference between the write operation and a previous write operation.

18. The system of claim 17, the operations further comprising determining a second value of the current set of values, wherein the second value comprises a second time difference between the write operation and a time associated with the command.

* * * * *